United States Patent
Ohno

(10) Patent No.: US 6,351,015 B1
(45) Date of Patent: Feb. 26, 2002

(54) TRANSISTOR DEVICE OF MOS STRUCTURE IN WHICH VARIATION OF OUTPUT IMPEDANCE RESULTING FROM MANUFACTURING ERROR IS REDUCED

(75) Inventor: Tsuyoshi Ohno, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/474,770

(22) Filed: Dec. 30, 1999

(30) Foreign Application Priority Data

Feb. 1, 1999 (JP) .......................................... 11-023903

(51) Int. Cl.$^7$ ............................................. H01L 29/78
(52) U.S. Cl. ..................... 257/379; 257/368; 257/380; 257/69; 257/369
(58) Field of Search ................................ 257/192, 207, 257/213, 412, 351, 538, 368, 369, 379, 69

(56) References Cited

U.S. PATENT DOCUMENTS 4,367,580 A * 1/1983 Guterman 5,013,678 A * 5/1991 Winnerl et al.
5,751,180 A * 5/1998 D'Addeo

FOREIGN PATENT DOCUMENTS

| JP | 06152206 A | * | 5/1994 |
| JP | 9-8286 | | 1/1997 |
| JP | 9-283710 | | 10/1997 |

* cited by examiner

*Primary Examiner*—Nathan Flynn
*Assistant Examiner*—Kevin Quinto
(74) *Attorney, Agent, or Firm*—Young & Thompson

(57) ABSTRACT

A MOS (Metal Oxide Semiconductor) transistor includes a gate electrode, a drain electrode, and a source electrode. The MOS transistor has an on-state resistance when the MOS transistor is in an ON state. The MOS transistor further includes a specific electrode, wherein the specific electrode connects the source electrode to a power supply section to which a power is supplied. The specific electrode has a resistance substantially identical to the on-state resistance. The specific electrode has a width substantially identical to a width of the gate electrode. The specific electrode and the gate electrode are formed at a same time.

12 Claims, 8 Drawing Sheets

Fig. 5

| | OUTPUT BUFFER 102 | CONVENTIONAL DEVICE |
|---|---|---|
| OUTPUT IMPEDANCE VARIATION RATE | 0.5% (24.88~25Ω) | 18.2% (20.46~25Ω) |
| OUTPUT THROUGH RATE VARIATION RATE | 0.5% | 18.2% |
| CONSUMPTION POWER VARIATION RATE | 0.5% | 22.2% |
| OPERATIONAL SPEED (CONVENTIONAL RATIO) | 1.1 | 1.0 |

TRANSISTOR DEVICE OF MOS STRUCTURE IN WHICH VARIATION OF OUTPUT IMPEDANCE RESULTING FROM MANUFACTURING ERROR IS REDUCED

BACKGROUND OF THE INVENTION

1. Field of the Invention

The present invention relates to a transistor device of MOS structure, a method for manufacturing the same, a transistor circuit of CMOS structure and an integrated circuit device having an output buffer.

2. Description of the Related Art

Now, various integrated circuit devices are used for various data processes. For example, there is an integrated circuit device in which interface is quickly carried out. Such an integrated circuit device is formed as structure in which a terminating resistor is connected to an output buffer of a quick interface. The output buffer is typically provided with a transistor circuit of CMOS structure.

A first conventional example of such a transistor circuit will be described below with reference to FIG. 1. FIG. 1 is a plan view showing the transistor circuit. Here, a transistor circuit 10 exemplified as the first conventional example is formed in the CMOS structure, and provided with a pair of transistor devices 11, 12 of the MOS structure in which conductive types are opposite to each other.

The pair of transistor devices 11, 12 have source electrodes 13, 14, drain electrodes 15, 16, gate electrodes 17, 18 and diffusion regions 19, 20, respectively. The source electrodes 13, 14 are opposite to the drain electrodes 15, 16 through the gate electrodes 17, 18 at the positions of the diffusion regions 19, 20, respectively.

A pair of gate electrodes 17, 18 are formed as a single piece, and commonly connected to one input terminal 21. A pair of drain electrodes 15, 16 are also formed as a single piece, and commonly connected to one output terminal 22. A pair of source electrodes 13, 14 are respectively connected to a pair of power supply terminals 23, 24.

The transistor circuit 10 having the above-mentioned structure can be used as an output buffer of a quick interface. In this case, an output terminal of a semiconductor circuit (not shown) is connected to the input terminal 21 of the transistor circuit 10. A terminating resistor (not shown) is connected to the output terminal 22 of the transistor circuit 10.

However, if an integrated circuit device having the above-mentioned structure is formed, the transistor circuit 10 and the terminating resistor are actually connected with each other through a transmission line. For this reason, if a transmission impedance of the transmission line and an output impedance of the transistor circuit 10 do not match with each other, various troubles occur, such as difficulty in quick transmission of the quick interface due to the occurrence of reflection noise and the like.

So, in an actual integrated circuit device, the transistor circuit 10 is designed such that if the transmission impedance of the transmission line connected to the output buffer (the transistor circuit 10) is known in advance, the output impedance of the output buffer is adapted to be matched with the transmission impedance. If the output impedance of the transistor circuit 10 and the transmission impedance of the transmission line match with each other as mentioned above, this method can protect the various troubles, such as the occurrence of the reflection noise and the like, to thereby improve the performance of the integrated circuit device.

As mentioned above, the various troubles in the integrated circuit device can be protected if the output impedance of the transistor circuit 10 is adapted to be matched with the transmission impedance of the transmission line.

However, the output impedance of the transistor circuit 10 is an impedance in the conductive section from the power supply terminals 23, 24 to the output terminal 22 when the gate electrodes 17, 18 are turned on. Thus, the output impedance of the transistor circuit 10 depends on the gate lengths which are layer widths of the gate electrodes 17, 18.

For this reason, if the gate lengths of the gate electrodes 17, 18 are varied because of manufacturing error, the output impedance of the transistor circuit 10 is also varied to thereby bring about the various troubles in the integrated circuit device. Especially, the gate lengths of the gate electrodes 17, 18 tend to be shortened in order to make the circuit highly integrated and reduce a consumption power in recent years. Hence, the affection of the variation in the gate length resulting from the manufacturing error becomes very serious.

Such as a transistor circuit 30 exemplified as a second conventional example in FIG. 2, there is also a product in which various electrodes 33 to 38 of transistor devices 31, 32 and diffusion regions 39, 40 are extended in a direction orthogonal to a gate length (a direction of a gate width) to relatively suppress the variation of an output impedance resulting from a variation of the gate length.

Here, the transistor circuit 30 is formed in CMOS structure and provided with a pair of transistor devices 31, 32 of MOS structure in which conductive types are opposite to each other.

The pair of transistor devices 31, 32 have source electrodes 33, 34, drain electrodes 35, 36, gate electrodes 37, 38 and diffusion regions 39, 40, respectively. The source electrodes 33, 34 are respectively opposite to the drain electrodes 35, 36 through the gate electrodes 37, 38 at the positions of the diffusion regions 39, 40, respectively.

A pair of gate electrodes 37, 38 are formed as a single piece, and commonly connected to one input terminal 21. A pair of drain electrodes 15, 16 are also formed as a single piece, and commonly connected to one output terminal 22. A pair of source electrodes 33, 34 are respectively connected to a pair of power supply terminals 23, 24.

For example, if the gate width is extended by N times, a variation of an output impedance resulting from the extension is 1/N. Nevertheless, the variation of the output impedance is still caused by the variation of the gate width. Moreover, if the various electrodes 33 to 38 and the diffusion regions 39, 40 are extended by several times as mentioned above, the integration degree of the transistor circuit 30 and the response thereof are dropped, and the consumption power is increased.

So, in an integrated circuit device employing an SSTL (Stub Series—Terminated Logic) manner as a quick interface and the like, the following method is proposed. That is a method for connecting a resistance element in series to an output terminal of an output buffer, and then connecting the output terminal of the output buffer to a transmission line through the resistance element to match an impedance of the output buffer with the resistance element to that of the transmission line. However, in this method, circuit elements are increased to thereby reduce the integration degree of the integrated circuit device and the productivity thereof. Thus, an operational speed of the quick interface is also impeded.

Japanese Laid Open Patent Application (JP-A-Heisei 9-8286) discloses a field effect transistor as described below.

An impedance converter is mounted between a gate electrode terminal and a gate electrode. Thus, this method can suppress the impedance mismatch between a first transmission line on which an input signal is transmitted and a second transmission line provided with a source electrode and the gate electrode. Moreover, a resistor whose value is defined so as to agree with a characteristic impedance of the second transmission line provided with the gate electrode and the source electrode is connected between the gate electrode and the source electrode. Hence, the second transmission line is terminated to thereby suppress the reflection of a transmission signal.

Japanese Laid Open Patent Application (JP-A-Heisei 9-283710) discloses a gate bias circuit of FET as described below. A signal through an input terminal and an impedance matching circuit is sent to a gate of the FET. A bias resistor and a bias adjustment circuit defines a gate bias voltage of the FET, in accordance with a voltage applied from a gate bias supply terminal. Then, the FET carries out an amplification at an operational point corresponding to the defined gate bias voltage. The bias adjustment circuit is formed together with the FET on a FET chip, and also has a resistance proportional to a pinch off voltage of the FET. Even if the pinch off voltage of the FET is changed, the resistance of the bias adjustment circuit is correspondingly changed which always applies a voltage proportional to the pinch off voltage, to the gate and the source of the FET, and further gives the same operational point.

SUMMARY OF THE INVENTION

The present invention is accomplished in view of the above mentioned problems. Therefore, an object of the present invention is to provide: a transistor device of MOS structure in which a variation in an output impedance resulting from a manufacturing error is reduced; a manufacturing method for forming the transistor device of the MOS structure so that an output impedance is not varied; a transistor circuit of CMOS structure in which a variation in an output impedance of a pair of transistor devices of the MOS structure is reduced; and an integrated circuit device having the transistor circuit as an output buffer.

In order to achieve an aspect of the present invention, a MOS (Metal Oxide Semiconductor) transistor includes a gate electrode, a drain electrode, a source electrode, wherein the MOS transistor has an on-state resistance when the MOS transistor is in an ON state and a specific electrode, wherein the specific electrode connects the source electrode to a power supply section to which a power is supplied, and has a resistance substantially identical to the on-state resistance, and a width substantially identical to a width of the gate electrode, and the specific electrode and the gate electrode are formed at a same time.

In order to achieve another aspect of the present invention, a MOS (Metal Oxide Semiconductor) transistor, includes a gate electrode, a drain electrode, a source electrode, wherein the MOS transistor has an on-state resistance when the MOS transistor is in an ON state, a plurality of specific electrodes in parallel with each other, wherein the plurality of specific electrodes connect the source electrode to a power supply section to which a power is supplied, and wherein the plurality of specific electrodes have a resistance substantially identical to the on-state resistance in total, and each of the plurality of specific electrodes has a width substantially identical to a width of the gate electrode, and the each specific electrode and the gate electrode are formed at a same time.

In order to achieve still another aspect of the present invention, a MOS (Metal Oxide Semiconductor) transistor, includes a gate electrode, a drain electrode, a source electrode, wherein the MOS transistor has an on-state resistance when the MOS transistor is in an ON state and a specific electrode, wherein the specific electrode connects the drain electrode to an output section from which an output signal outputted from the MOS transistor is outputted, and has a resistance substantially identical to the on-state resistance, and a width substantially identical to a width of the gate electrode, and the specific electrode and the gate electrode are formed at a same time.

In order to achieve yet still another aspect of the present invention, a MOS (Metal Oxide Semiconductor) transistor, includes a gate electrode, a drain electrode, a source electrode, wherein the MOS transistor has an on-state resistance when the MOS transistor is in an ON state, a plurality of specific electrodes in parallel with each other, wherein the plurality of specific electrodes connect the drain electrode to an output section from which an output signal outputted from the MOS transistor is outputted, and wherein the plurality of specific electrodes have a resistance substantially identical to the on-state resistance in total, and each of the plurality of specific electrodes has a width substantially identical to a width of the gate electrode, and the each specific electrode and the gate electrode are formed at a same time.

In this case, the MOS transistor further includes a specific MOS transistor, wherein the specific MOS transistor has the specific electrode as a specific gate electrode of the specific MOS transistor, and a specific source electrode and a specific drain electrode of the specific MOS transistor which are connected to the power supply section.

Also in this case, the MOS transistor further includes a plurality of specific MOS transistors, wherein the plurality of specific MOS transistors have the plurality of specific electrodes as a plurality of specific gate electrodes of the plurality of specific MOS transistors, respectively, and a plurality of specific source electrodes and a plurality of specific drain electrodes of the plurality of specific MOS transistors respectively, the plurality of specific source electrodes and the plurality of specific drain electrodes being connected to the power supply section.

Further in this case, the MOS transistor further includes a specific MOS transistor, wherein the specific MOS transistor has the specific electrode as a specific gate electrode of the specific MOS transistor, and a specific source electrode and a specific drain electrode of the specific MOS transistor which are connected to the output section.

In this case, the MOS transistor further includes a plurality of specific MOS transistors, wherein the plurality of specific MOS transistors have the plurality of specific electrodes as a plurality of specific gate electrodes of the plurality of specific MOS transistors, respectively, and a plurality of specific source electrodes and a plurality of specific drain electrodes of the plurality of specific MOS transistors respectively, the plurality of specific source electrodes and the plurality of specific drain electrodes being connected to the output section.

In order to achieve still another aspect of the present invention, a MOS (Metal Oxide Semiconductor) transistor manufacturing method, includes (a) forming a gate electrode, (b) forming a drain electrode, (c) forming a source electrode such that the source electrode is spaced from a power supply section to which a power is supplied, (d) forming a line in a manufacturing process substantially identical to a manufacturing process in which the gate electrode is formed such that the line has a resistance substantially identical to an on-state resistance of a MOS transistor including the gate electrode, the drain electrode and the source electrode when the MOS transistor is in an ON state, and a width substantially identical to a width of the gate electrode, and (e) connecting the line between the source electrode and the power supply section.

In order to achieve another aspect of the present invention, a MOS (Metal Oxide Semiconductor) transistor manufacturing method, includes (f) forming a gate electrode, (g) forming a drain electrode, (h) forming a source electrode such that the source electrode is spaced from a power supply section to which a power is supplied, (i) forming a plurality of lines in a manufacturing process substantially identical to a manufacturing process in which the gate electrode is formed such that the plurality of lines have a resistance in total substantially identical to an on-state resistance of a MOS transistor including the gate electrode, the drain electrode and the source electrode when the MOS transistor is in an ON state, and each of the plurality of lines has a width substantially identical to a width of the gate electrode, and (j) connecting the plurality of lines between the source electrode and the power supply section.

In order to achieve another aspect of the present invention, a MOS (Metal Oxide Semiconductor) transistor manufacturing method, includes (k) forming a gate electrode, (l) forming a source electrode, (m) forming a drain electrode such that the drain electrode is spaced from an output section from which an output signal outputted from a MOS transistor including the gate electrode, the drain electrode and the source electrode is outputted, (n) forming a line in a manufacturing process substantially identical to a manufacturing process in which the gate electrode is formed such that the line has a resistance substantially identical to an on-state resistance of the MOS transistor when the MOS transistor is in an ON state, and a width substantially identical to a width of the gate electrode, and (o) connecting the line between the drain electrode and the output section.

In order to achieve another aspect of the present invention, a MOS (Metal Oxide Semiconductor) transistor manufacturing method, includes (p) forming a gate electrode, (q) forming a source electrode, (r) forming a drain electrode such that the drain electrode is spaced from an output section from which an output signal outputted from a MOS transistor including the gate electrode, the drain electrode and the source electrode is outputted, (s) forming a plurality of lines in a manufacturing process substantially identical to a manufacturing process in which the gate electrode is formed such that the plurality of lines have a resistance in total substantially identical to an on-state resistance of the MOS transistor when the MOS transistor is in an ON state, and each of the plurality of lines has a width substantially identical to a width of the gate electrode, and (t) connecting the plurality of lines between the drain electrode and the output section.

In this case, the MOS transistor manufacturing method, further includes (u) forming a specific MOS transistor, wherein the specific MOS transistor has the line as a specific gate electrode of the specific MOS transistor, and (v) connecting a specific source electrode and a specific drain electrode of the specific MOS transistor to the power supply section.

Also in this case, the MOS transistor manufacturing method, further includes (w) forming a plurality of specific MOS transistors, wherein the plurality of specific MOS transistors have the plurality of lines as a plurality of specific gate electrodes of the plurality of specific MOS transistors, respectively, and (x) connecting a plurality of specific source electrodes and a plurality of specific drain electrodes of the plurality of specific MOS transistors to the power supply section.

In this case, the MOS transistor manufacturing method, further includes (y) forming a specific MOS transistor, wherein the specific MOS transistor has the line as a specific gate electrode of the specific MOS transistor; and (z) connecting a specific source electrode and a specific drain electrode of the specific MOS transistor to the output section.

Also in this case, the MOS transistor manufacturing method, further includes (aa) forming a plurality of specific MOS transistors, wherein the plurality of specific MOS transistors have the plurality of lines as a plurality of specific gate electrodes of the plurality of specific MOS transistors, respectively, and (ab) connecting a plurality of specific source electrodes and a plurality of specific drain electrodes of the plurality of specific MOS transistors to the output section.

In order to achieve still another aspect of the present invention, a transistor circuit, includes complementary transistors, wherein each of the complementary transistors is a MOS (Metal Oxide Semiconductor) type and a plurality of power supply sections to which a power is supplied, and wherein each of the complementary transistors includes a gate electrode, a drain electrode, a source electrode, wherein the each complementary transistor has an on-state resistance when the each complementary transistor is in an ON state, a specific electrode, wherein the specific electrode connects the source electrode to one of the plurality of power supply sections, and has a resistance substantially identical to the on-state resistance, and a width substantially identical to a width of the gate electrode, and the specific electrode and the gate electrode are formed at a same time.

In order to achieve still another aspect of the present invention, a transistor circuit, includes complementary transistors, wherein each of the complementary transistors is a MOS (Metal Oxide Semiconductor) type and an output section from which an output signal outputted from the complementary transistors is outputted, and wherein each of the complementary transistors includes a gate electrode, a drain electrode, a source electrode, wherein the each complementary transistor has an on-state resistance when the each complementary transistor is in an ON state, a specific electrode, wherein the specific electrode connects the drain electrode to the output section, and has a resistance substantially identical to the on-state resistance and a width substantially identical to a width of the gate electrode, and the specific electrode and the gate electrode are formed at a same time.

In order to achieve still another aspect of the present invention, a semiconductor integrated circuit, includes an output buffer including an output section from which an output signal outputted from the output buffer is outputted, wherein the output buffer includes complementary transistors, each of the complementary transistors being a MOS (Metal Oxide Semiconductor) type, a transmission path having a transmission impedance, wherein the transmission path is connected to the output section and a plurality of power supply sections to which a power is supplied, wherein the plurality of power supply sections are connected to the complementary transistors, respectively, and wherein the each complementary transistor includes a gate electrode, a drain electrode, a source electrode, wherein the each complementary transistor has an on-state resistance when the each complementary transistor is in an ON state, a specific electrode, wherein the specific electrode connects the source electrode to one of the plurality of power supply sections, and has a resistance substantially identical to the on-state resistance, and a width substantially identical to a width of the gate electrode, and the specific electrode and the gate electrode are formed at a same time, and wherein the transmission impedance is substantially identical to an output impedance, of each complementary transistor, corresponding to a specific transmission path arranged from the one power supply section to the output section, when each complementary transistor is in an ON state.

In this case, the semiconductor integrated circuit, according to claim 19, wherein the each complementary transistor further including a specific MOS transistor, wherein the specific MOS transistor has the specific electrode as a specific gate electrode of the specific MOS transistor, and a specific source electrode and a specific drain electrode of the specific MOS transistor which are connected to the one power supply section.

A layer width used in the present invention implies a width in a certain direction of a wiring pattern, and then implies a gate length in a gate electrode, and further implies a width in the same direction as the gate length in a resistor electrode.

In addition, the above-mentioned effect when the power supply terminal and the source electrode of the transistor device are connected with each other through the gate electrode of the transistor structure is verified by the experiment of the inventor, and described in detail in Japanese Patent Application (Japanese patent application No. Heisei 10-281728) filed by this applicant. The mechanism is following. If two transistors are connected in serial between the power supply terminal and the source electrode of the transistor device, a parasitic capacitance connected to the connection node of the two transistors helps the power supply from the power supply terminal to the transistor of the source electrode side of the two transistors by the charging current of the parasitic capacitance, when the transistor of the source electrode side is turned on. Accordingly, the switching response of the transistor of the source electrode side is made excellent.

BRIEF DESCRIPTION OF THE DRAWINGS

A more complete understanding of the teachings of the present invention may be acquired by referring to the accompanying figures, in which like reference numbers indicate like features and wherein:

FIG. 5 is a table showing a result of simulating a differences between performances of the first embodiment and those of a conventional device;

DESCRIPTION OF THE PREFERRED EMBODIMENTS

Embodiments of a transistor device according to the present invention will be described below with reference to the attached drawings.

Figure 1:
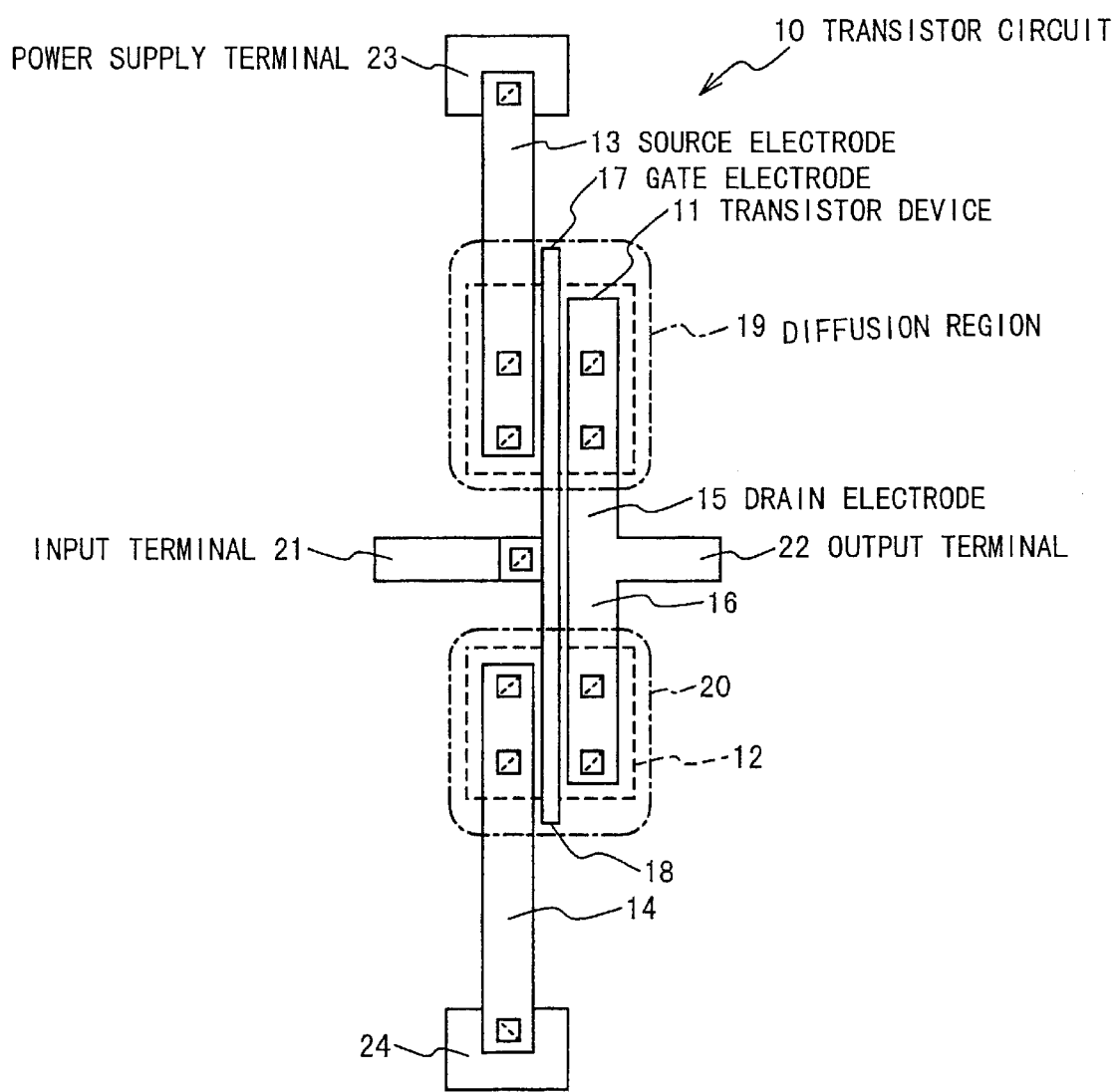
FIG. 1 is a plan view showing a transistor circuit in a first conventional example.
Figure 2:
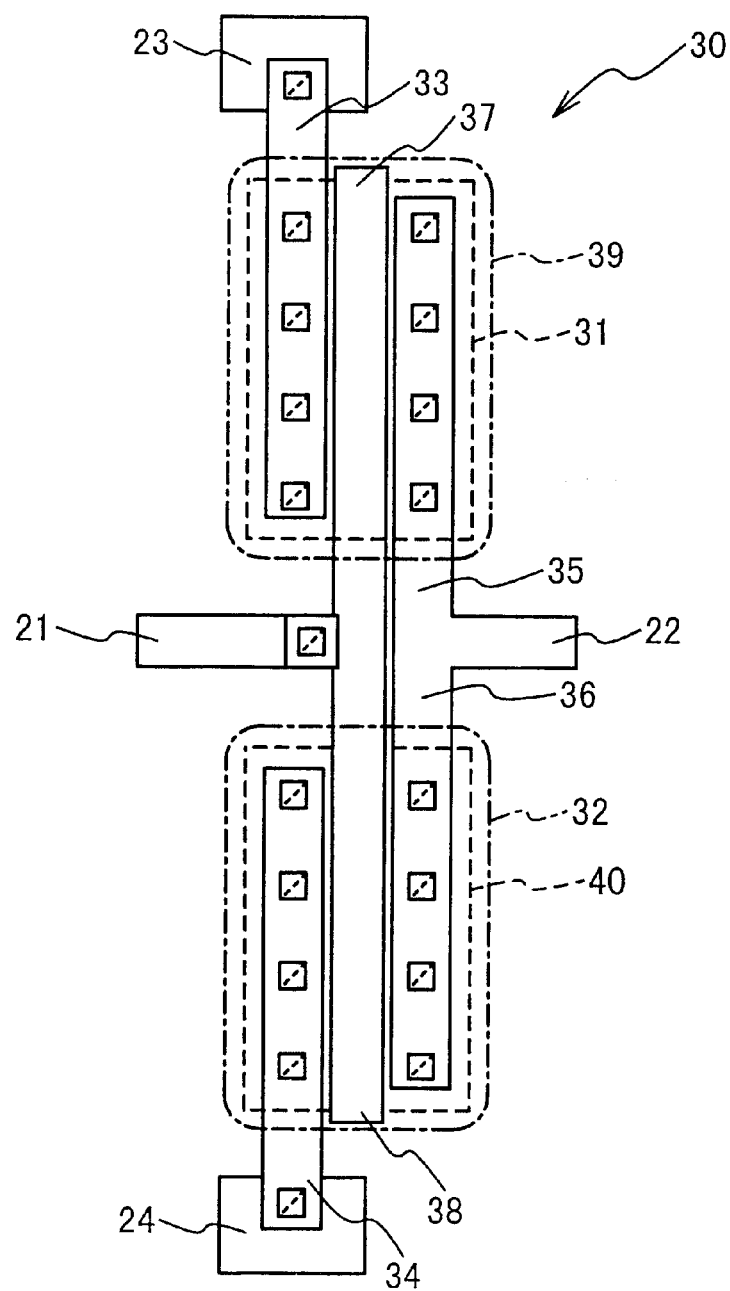
FIG. 2 is a plan view showing a transistor circuit in a second conventional example.
Figure 3:
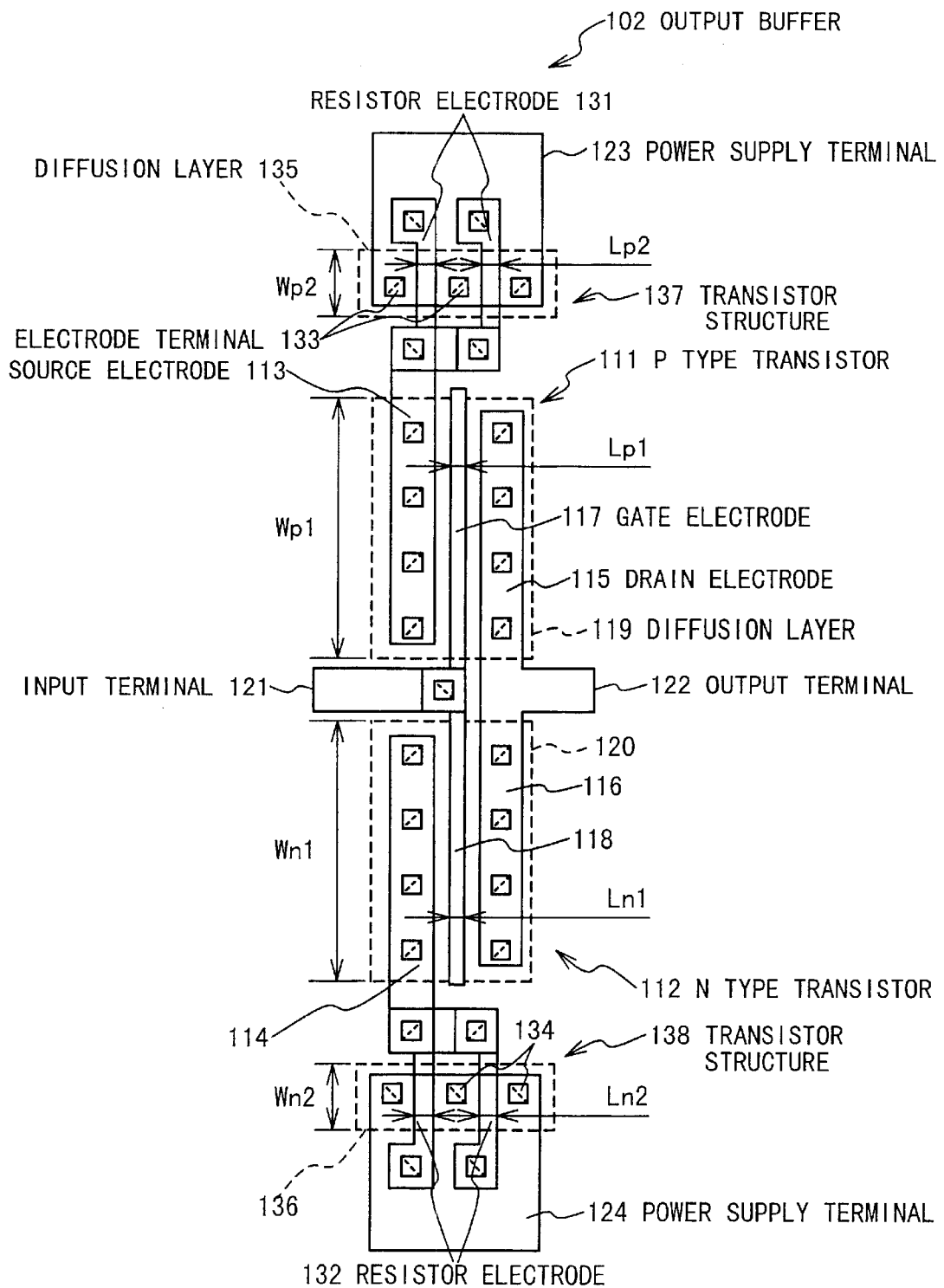
FIG. 3 is a plan view showing an output buffer which is a first embodiment in a transistor circuit of the present invention.
Figure 4:
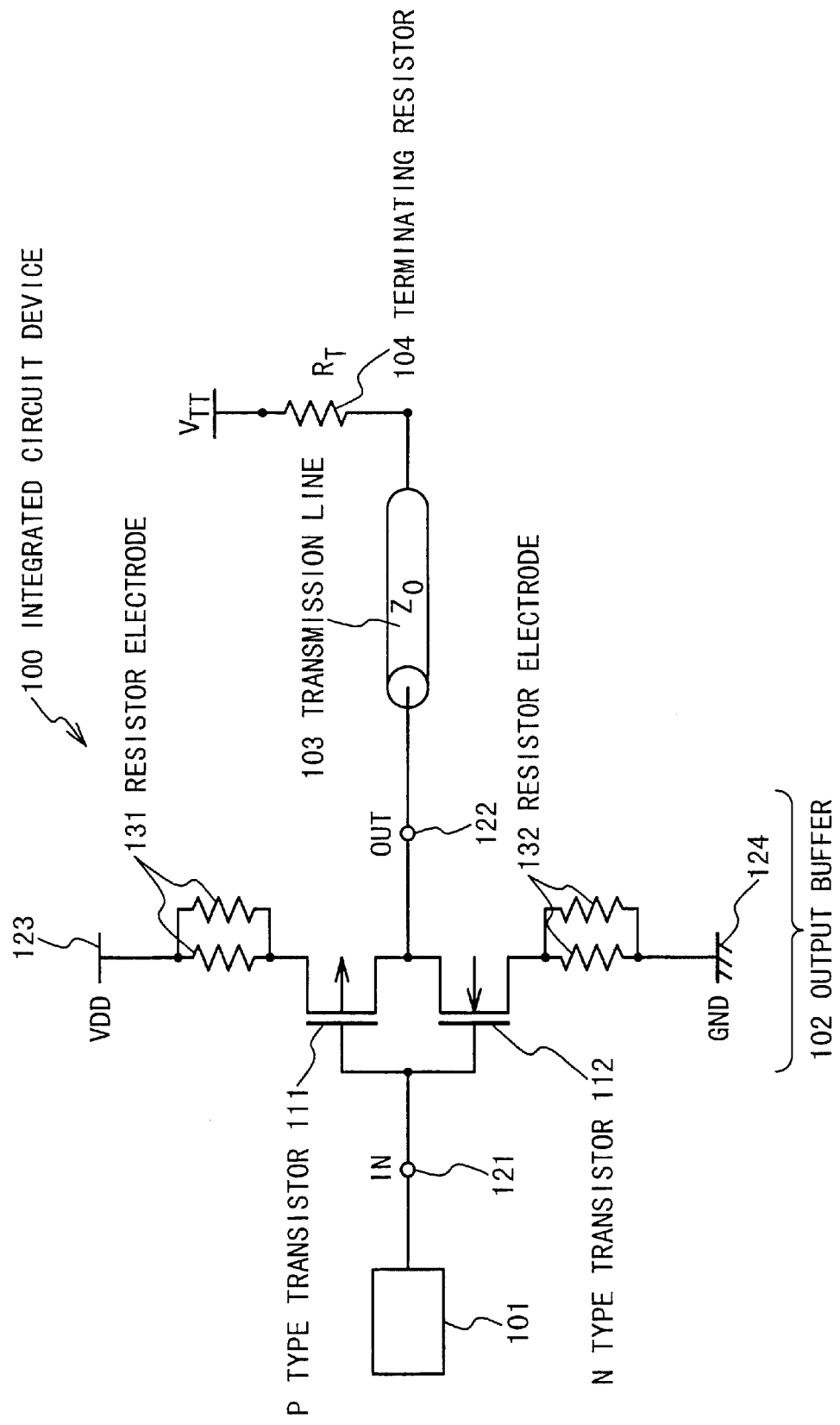
FIG. 4 is a circuit diagram showing an equivalent circuit of an integrated circuit device.

A first embodiment of the present invention will be described below with reference to FIGS. 3 to 5. In this case, the same names are given to the sections equal to those of the above-mentioned conventional example, with regard to this embodiment. Then, the detailed explanations are omitted. FIG. 3 is a plan view showing an output buffer which is a first embodiment in a transistor circuit of the present invention. FIG. 4 is a circuit diagram showing an equivalent circuit of an integrated circuit device. And, FIG. 5 is a plan view showing a transistor circuit in a reference example.

An integrated circuit device 100 in this embodiment is formed as a quick interface such as SSTL and the like. As shown in FIG. 4, a terminating resistor 104 is connected through an output buffer 102 and a transmission line 103 to a semiconductor circuit 101.

The output buffer 102 of the integrated circuit device 100 is provided with a transistor circuit of the CMOS structure similar to the conventional examples, as shown in FIGS. 3 and 4, and has a p-type transistor 111 and an n-type transistor 112 as a pair of transistor devices in which the conductive types are opposite to each other.

The p-type transistor device 111 has a source electrode 113, a drain electrode 115, a gate electrode 117 and a diffusion layer 119. The n-type transistor device 112 has a source electrode 114, a drain electrode 116, a gate electrode 118 and a diffusion layer 120. A pair of gate electrodes 117, 118 are formed as a single piece, and commonly connected to one input terminal 121. A pair of drain electrodes 115, 116 are also formed as a single piece, and commonly connected to one output terminal 122.

Then, a pair of source electrodes 113, 114 are connected to power supply terminals 123, 124, respectively. However, differently from the conventional examples, the source electrodes 113, 114 are formed to be separated from the power supply terminals 123, 124, respectively. So, the source electrode 113 is connected through a pair of resistor electrodes 131 to the power supply terminal 123, and the source electrode 114 is connected through a pair of resistor electrodes 132 to the power supply terminal 124.

In further detail, the source electrode 113 and the power supply terminal 123 are connected with each other through the pair of resistor electrodes 131 in parallel. Each of the pair of resistor electrodes 131 is formed in a layer width equal to a gate length of the gate electrode 117. A total of the resistances of the pair of resistor electrodes 131 is equal to an on-state resistance of the p-type transistor 111.

Similarly, the source electrode 114 and the power supply terminal 124 are connected with each other through the pair of parallel resistor electrodes 132. In the pair of resistor electrodes 132, each is formed in a layer width equal to a gate length of the gate electrode 118, and a total of the resistances is equal to an on-state resistance of the n-type transistor 112.

The output buffer 102 of the integrated circuit device 100 is formed in the process similar to those of the conventional examples by using thin film technique. However, the pair of resistor electrodes 131 in the p-type transistor 111 are formed in the process identical to that of the gate electrode 117, and the pair of resistor electrodes 132 in the n-type transistor 112 are formed in the process identical to that of the gate electrode 118.

In addition, diffusion layers 135, 136 and electrode terminals 133, 134 serving as source/drain electrodes are formed at the positions of the two pairs of resistor electrodes 131, 132 in the p/n-type transistors 111, 112, respectively. Thus, transistor structures 137, 138 in which the two pairs of resistor electrodes 131, 132 serve as gate electrodes are formed in the above-mentioned positions, respectively. The electrode terminals 133, 134 are also connected to the power supply terminals 123, 124, respectively.

The semiconductor circuit 101 is connected to the input terminal 121 of the output buffer 102, and the terminating resistor 104 is connected through the transmission line 103 to the output terminal 122. In this case, a transmission impedance of the transmission line 103 is equal to the output impedance of each of the p/n-type transistors 111, 112.

In the above-mentioned configuration, in the integrated circuit device 100, the quick interface such as SSTL and the like is established by the connection of the output buffer 102 of the CMOS structure to the semiconductor circuit 101. The terminating resistor 104 is connected through the transmission line 103 to the output buffer 102 in this quick interface.

Since the output impedance of the output buffer 102 is equal to the transmission impedance of the transmission line 103, it is possible to protect the various troubles, such as the occurrence of reflection noise and the like. Accordingly, in the integrated circuit device 100, the semiconductor circuit 101 and the output buffer 102 can function excellently as the quick interface.

In the integrated circuit device 100, the two pairs of resistor electrodes 131, 132 serve as the gate electrodes of the transistor structures 137, 138, respectively. In this case, they are formed in the same gate lengths and in the same processes as the gate electrodes 117, 118, respectively. Thus, if the gate lengths of the gate electrodes 117, 118 are increased or decreased because of the manufacturing error, the gate lengths of the resistor electrodes 131, 132 are similarly increased or decreased.

Also, the source electrodes 113, 114 and the power supply terminals 123, 124 are formed to be separated from each other, and connected with each other through the two pairs of resistor electrodes 131, 132, respectively. The total resistance of the resistor electrodes 131 is equal to the on-state resistance of the p-type transistor 111. The total resistance of the resistor electrodes 132 is equal to the on-state resistance of the n-type transistor 112.

Thus, the increase or decrease in the gate lengths of the gate electrodes 117, 118 affects so as to increase or decrease the output impedance of the p/n-type transistors 111, 112, respectively. However, in this case, the increase or decrease in the gate lengths of the gate electrodes 131, 132 also affects the output impedance of the p/n-type transistors 111, 112, respectively. Hence, these affections are equal in degree and opposite in direction.

Due to these features, in the integrated circuit device 100, the output impedances of the p/n-type transistors 111, 112 are not varied even if the gate lengths of the gate electrodes 117, 118, 131 and 132 are varied because of the manufacturing error. Thus, the output impedance of the output buffer 102 and the transmission impedance of the transmission line 103 are excellently matched with each other, even in the case of the occurrence of the manufacturing error. Hence, it is possible to surely protect the various troubles, such as the occurrence of reflection noise and the like.

Moreover, in the integrated circuit device 100, the two pairs of resistor electrodes 131, 132 for respectively connecting the source electrodes 113, 114 to the power supply terminals 123, 124 serve as the gate electrodes of the transistor structures 137, 138, respectively.

Due to this mechanism, switching powers of the transistor structures 137, 138 are added to switching powers of the p/n-type transistors 111, 112, respectively. Thus, these additions make the switching responses of the p/n-type transistors 111, 112 excellent. Hence, the semiconductor circuit 101 and the output buffer 102 can function in extremely excellent condition as the quick interface.

Moreover, in the integrated circuit device 100, the source electrode 113 and the power supply terminal 123 are connected with each other through the two resistor electrodes 131, and the source electrode 114 and the power supply terminal 124 are connected with each other through the two resistor electrodes 132. Due to these connections, even if sheet resistances of the resistor electrodes 131, 132 are excessive, it is possible to generate in total the resistance equal to the on-state resistance of the p/n-type transistors 111, 112 with the gate lengths respectively equal to the gate electrodes 117, 118.

Here, for the purpose of simple explanation, let us suppose an n-type transistor 112 having one resistor electrode 132, and actually consider a dimension optimal for each section. At first, if a gate length of the gate electrode 118 is "Ln1" and a gate width thereof is "Wn1" as shown in FIG. 3, an on-state resistance "Ron" of the n-type transistor 112 is proportional to "Ln1/Wn1" as follows:

Ron Ln1/Wn1.

Similarly, if a gate length of the resistor electrode 132 is "Ln2" and a gate width thereof is "Wn2", a resistance "Rgate" thereof is proportional to "Wn2/Ln2" as follows Rgate "Wn2/Ln2".

Here, if it is assumed that coefficients of the gate electrode 118 and the resistor electrode 132 are respectively "A, B", "Ron" and "Rgate" are represented as follows:

Ron=A·Ln1/Wn1

Rgate=B·Wn2/Ln2.

Then, a total resistance "Rtotal" of the gate electrode 118 and the resistor electrode 132 is represented as follows:

Rtotal=A·Ln1/Wn1+B·Wn2/Ln2.

Since the output impedance of the n-type transistor 112 corresponds to the resistance "Rtotal", it is required to minimize the variation of the resistance "Rtotal". Here, if it is assumed that variation values of the gate lengths in the gate electrode 118 and the resistor electrode 132 are "ΔL" and a variation value of the resistance "Rtotal" is "ΔRtotal", it is represented as follows:

ΔRtotal=[A(Ln1+ΔL)/Wn1+B·Wn2/(Ln2+ΔL)]−(A·Ln1/Wn1+B·Wn2/Ln2)=A·ΔL/Wn1−B·Wn2·ΔL/Ln2(Ln2+ΔL).

When the resistance "ΔRtotal" is replaced with "0" which is an optimal value, it is represented as follows:

0=A·L/Wn1−B·Wn2·ΔL/Ln2(Ln2+ΔL)A·ΔL/Wn1=B·Wn2·ΔL/Ln2(Ln2+ΔL)=(ΔL/Ln2+ΔL)·(B·Wn2/Ln2)=(ΔL/Ln2+ΔL)·Rgate.

If the above-mentioned equation is established under the condition that the variation values "ΔL" occur in the gate lengths of the gate electrode 118 and the resistor electrode 132, the variations in the resistances in the gate electrode 118 and the resistor electrode 132 are canceled to thereby stabilize the output impedance of the output buffer 102. If the above-mentioned equation is further changed, it is represented as follows:

$$Rgate = B \cdot Wn2/Ln2 = A(Ln2+\Delta L)/Wn1. \quad (1)$$

When this equation is established, the variation becomes minimum.

A case in which a dimension of each section is determined from a desired resistance "Rtotal" will be described below. As mentioned above, the resistance "Rtotal" is represented as follows:

$$Rtotal = A \cdot Ln1/Wn1 + B \cdot Wn2/Ln2 = A \cdot Ln1/Wn1 + Rgate.$$

When the equation (1) in the optimal condition is substituted for that equation, it is represented as follows:

$$Rtotal = A \cdot Ln1/Wn1 + A(Ln2+\Delta L)/Wn1. \quad (2)$$

$$= A(Ln1+Ln2+\Delta L)/Wn1. \quad (3)$$

In short, if the desired resistance "Rtotal" and the gate length "Ln1" of the gate electrode 118 are known, the gate width "Wn1" is automatically determined. And, if the desired resistance "Rtotal" and the gate width "Wn1" are known, the gate length "Ln1 (=Ln2)" is determined.

By referring to the equation (3), the increase of the gate width "Wn1" is also required if the gate length "Ln1 (=Ln2)" is increased when the desired resistance "Rtotal" is determined. However, this condition causes an region of the n-type transistor 112 to be increased. Moreover, a gate capacitance that becomes a load on the semiconductor circuit 101 at the former stage of the n-type transistor 112, is increased, which accordingly makes the quick operation difficult.

In short, it is optimal to minimize the gate length "Ln1 (=Ln2)" in the output buffer 102 of the quick interface. So, the gate width "Wn1" is determined by substituting a known tolerance for the variation value "ΔL" of the gate length, when "Ln1 (=Ln2)" is defined as a minimum value. The gate width "Wn2" is also determined by substitute them for the above-mentioned equation.

Then, a gate width "Wn2" of a resistor electrode 132 at which the variation of the resistance "Rtotal" can be canceled even if the variation value of the gate length is "0" or "ΔL" is represented as follows:

$$Wn2 = (Rtotal - A \cdot Ln1/Wn1)Ln2/B.$$

By collecting the above-mentioned results, it is preferable that the gate lengths "Ln1, Ln2" of the gate electrode 118 and the resistor electrode 132 are equal to each other and also minimum. It is also preferable that the on-state resistance "Ron" of the n-type transistor 112 and the resistance "Rgate" of the resistor electrode 132 are different from each other by "A·Ln1/Wn1". Incidentally, only the n-type transistor 112 is explained in the above-mentioned description. However, it is natural that the above-pointed items can be equally applied to the p-type transistor 111.

When simulating the differences between performances of the output buffer 102 in this embodiment and those of the conventional device (not shown), if the desired resistance "Rtotal=25 (ohms)", the coefficient "A=12500", the coefficient "B=5.5", the variation value "ΔL=0.05 (μm)" and the gate lengths "Ln1=Ln2=0.25 (μm)", they are represented in FIG. 5.

In FIG. 5, the above-mentioned conventional device implies a structure which does not have the resistor electrodes 131, 132.

Figure 6:
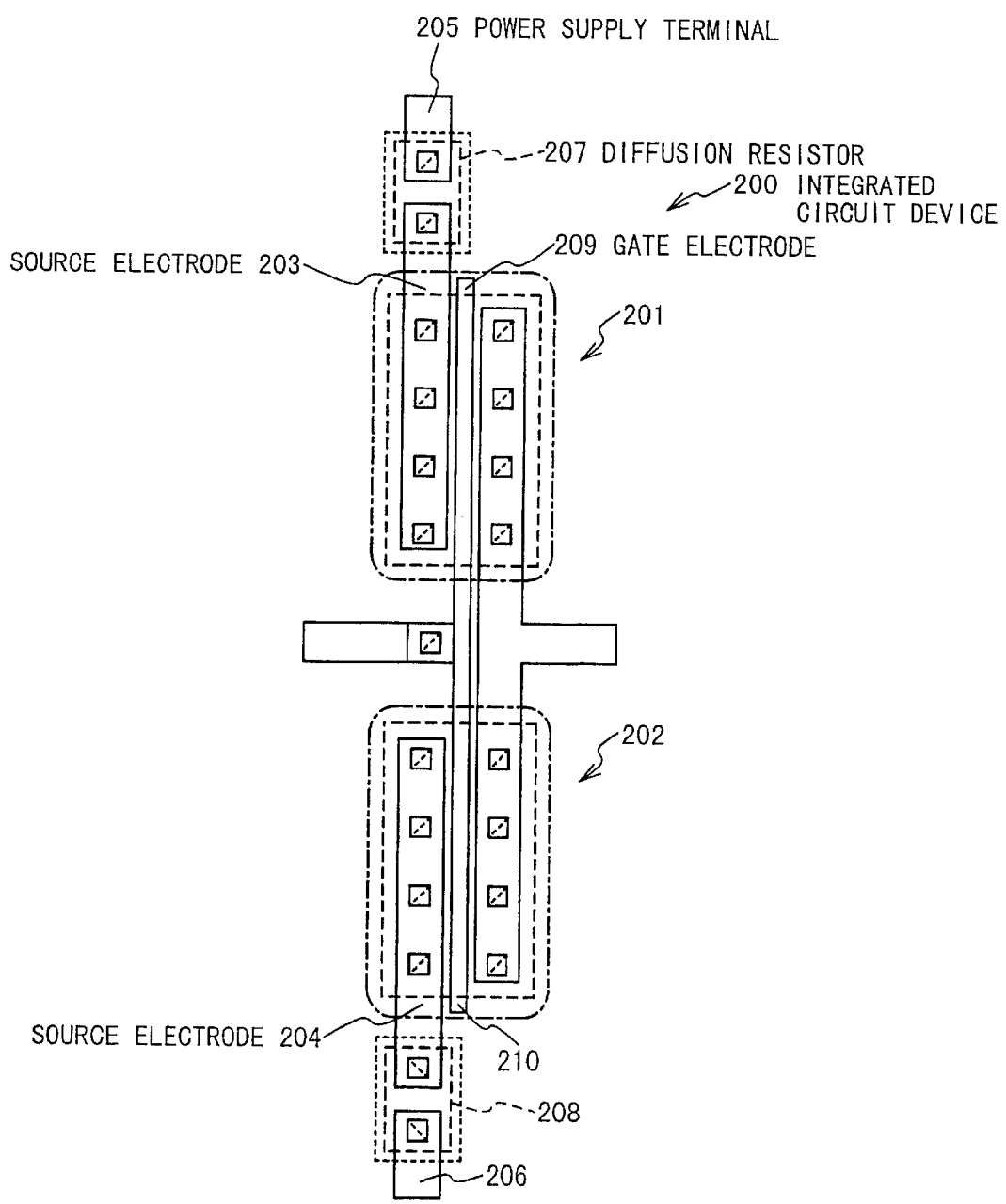
FIG. 6 is a plan view showing a transistor circuit in a reference example.

Here, an existing transistor circuit 200 similar to the output buffer 102 in this embodiment is described with reference to FIG. 6, as a reference example. In this transistor circuit 200, source electrodes 203, 204 of transistor devices 201, 202 of the MOS structure and power supply terminals 205, 206 are connected with each other through diffusion resistors 207, 208, respectively.

In this transistor circuit 200, the switching noise can be suppressed by the above-mentioned structure. However, it can not cancel out the variations in the resistances of the diffusion resistors 207, 208 and gate electrodes 209, 210 resulting from the manufacturing error, differently from the output buffer 102 in this embodiment.

For this reason, the transistor circuit 200 can not protect the variation in the output impedance resulting from the manufacturing error. Rather, because of the manufacturing error, the resistances of the diffusion resistors 207, 208 are varied independently of the resistances of the gate electrodes 209, 210. Thus, the output impedance can not be made stable.

In addition, the present invention is not limited to the above-mentioned embodiment shown in FIGS. 3, 4 and 5. Various modifications and adaptations may be made thereto in the range without departing from the spirit. For example, in the above-mentioned embodiment, the resistor electrodes 131, 132 are exemplified as the gate electrodes of the transistor structures 137, 138. However, it is also possible to design without forming such transistor structures 137, The above-mentioned embodiment is exemplified such that the source electrode 113 and the power supply terminal 123 are connected with each other through the two resistor electrodes 131 and also the source electrode 114 and the power supply terminal 124 are connected with each other through the two resistor electrodes 132. However, the number of resistor electrodes may be variously changed if the necessary conditions are met.

Moreover, the above-mentioned embodiment is exemplified such that the source electrode 113 and the power supply terminal 123 are connected with each other through the resistor electrodes 131, 132 for stabilizing the output impedance of the output buffer 102. However, it is also possible to use such resistor electrodes 131, 132 to connect the drain electrodes 115, 116 to the output terminal 122.

Also, in the above-mentioned embodiment, the output buffer 102 having the CMOS structure is exemplified as the transistor circuit in which the output impedance is not varied because of the manufacturing error. However, it is not limited to the CMOS structure. For example, it is also possible to singly form the p-type transistor 111 or the n-type transistor 112 to accordingly design the transistor device of the MOS structure in which the output impedance is not varied because of the manufacturing error.

Figure 7:
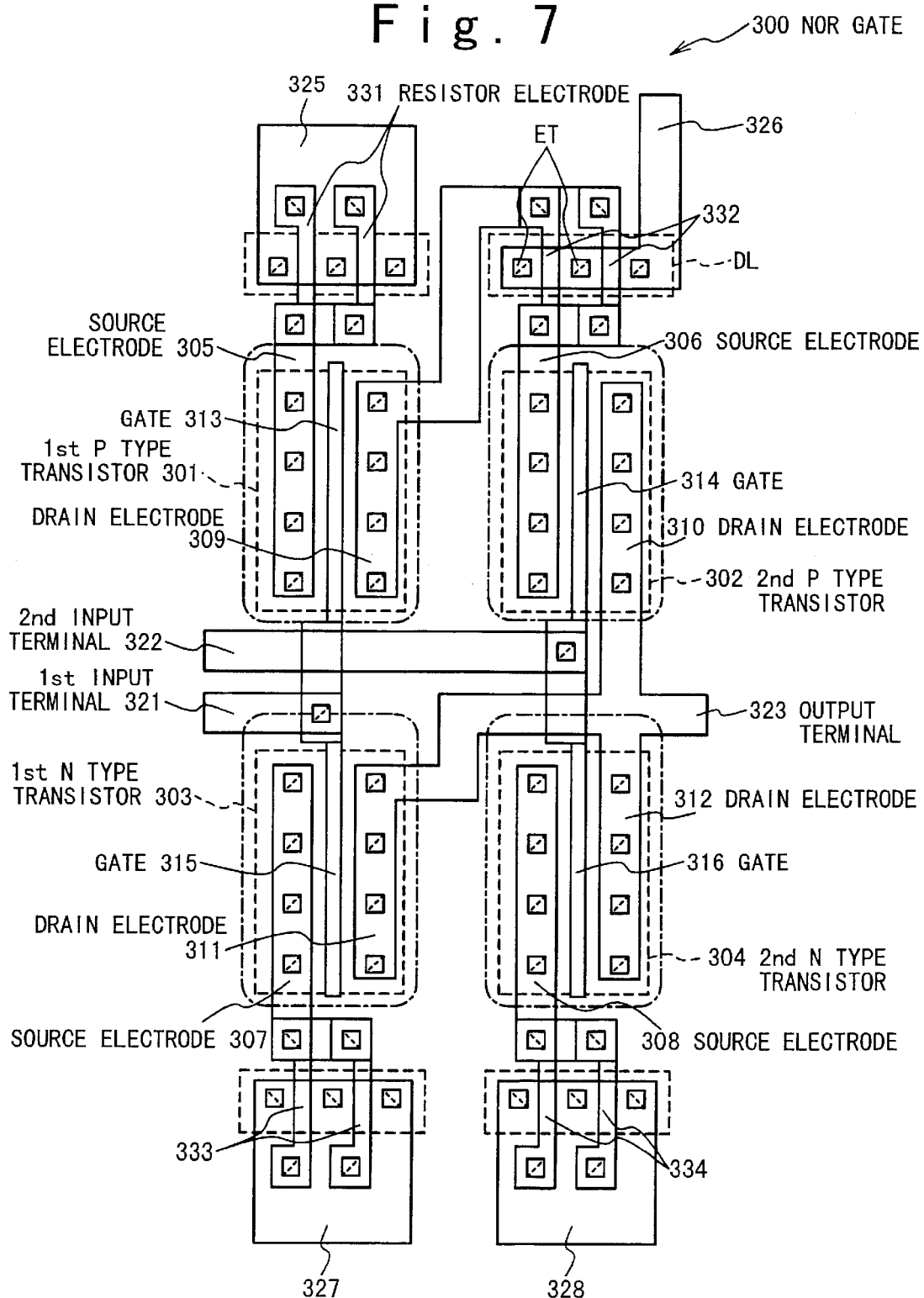
FIG. 7 is a plan view showing a NOR gate which is a second embodiment in a transistor circuit of the present invention.
Figure 8:
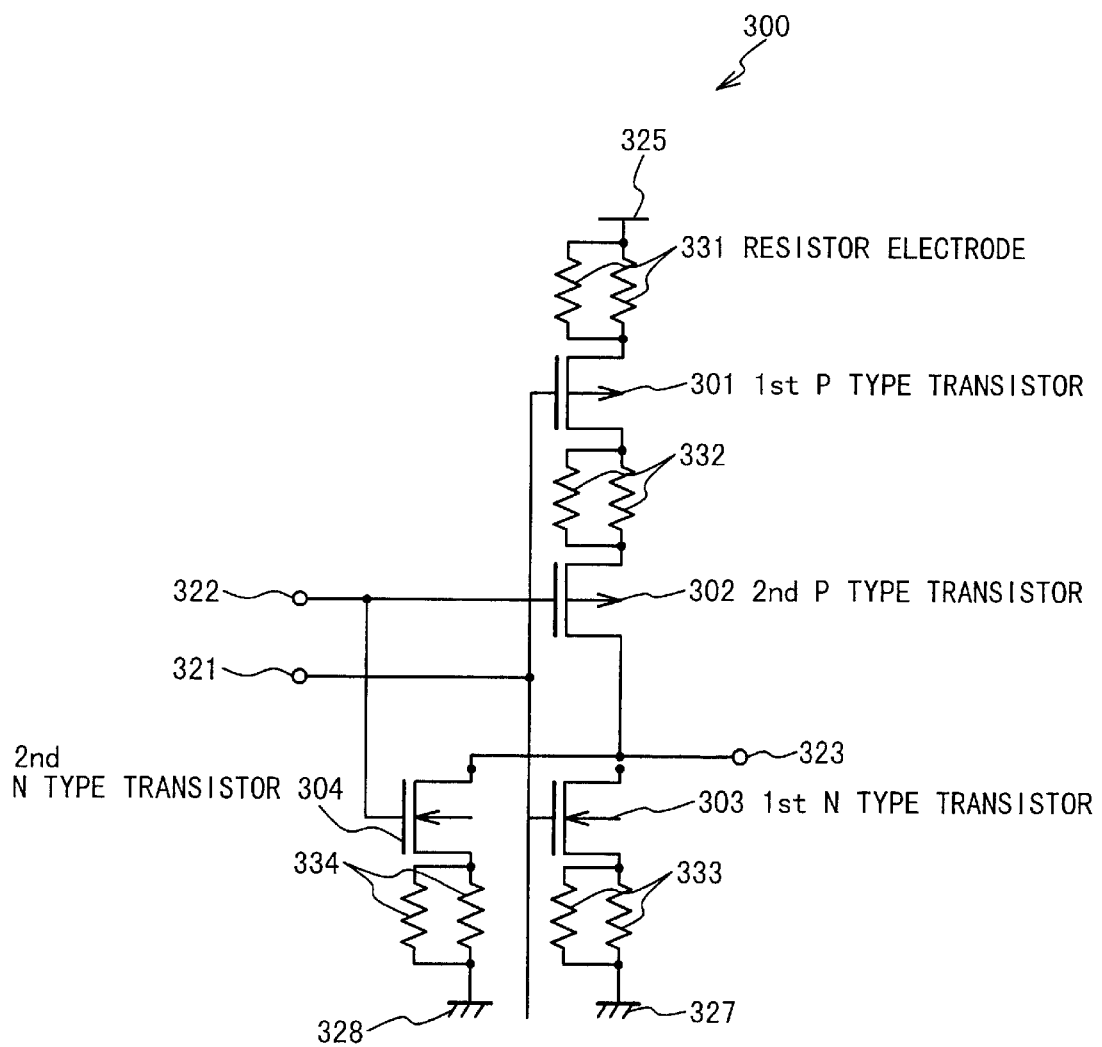
FIG. 8 is a circuit diagram showing an equivalent circuit of the NOR gate.

A second embodiment of the present invention will be described below with reference to FIGS. 7 and 8. However, the same names are given to the sections identical to those of the first embodiment, with regard to this second embodiment. Then, the detailed explanations are omitted. FIG. 7 is a plan view showing a NOR gate which is a second embodiment in a transistor circuit of the present invention, and FIG. 8 is a circuit diagram showing an equivalent circuit of the NOR gate.

A NOR gate 300 which is a transistor circuit in this embodiment is provided with first and second p-type transistors 301, 302 and first and second n-type transistors 303, 304, as four MOS structure transistor devices. The transistor 301 has a source electrode 305, a drain electrode 309 and a gate electrode 313. The transistor 302 has a source electrode 306, a drain electrode 310 and a gate electrode 314. The transistor 303 has a source electrode 307, a drain electrode 311 and a gate electrode 315. And, the transistor 304 has a source electrode 308, a drain electrode 312 and a gate electrode 316.

The NOR gate 300 has first and second input terminals 321, 322 and one output terminal 323. The first input terminal 321 is connected to the gate electrode 313 of the first p-type transistor 301 and the gate electrode 315 of the first n-type transistor 303. The second input terminal 322 is connected to the gate electrode 314 of the second p-type transistor 302 and the gate electrode 316 of the second n-type transistor 304. The output terminal 323 is connected to the drain electrode 310 of the second p-type transistor 302 and the drain electrode 312 of the second n-type transistor 304.

Also, resistor electrodes 331 to 334 are respectively connected to the source electrodes 305 to 308 of the transistors 301 to 304, in pairs. Power supply terminals 325 to 328 are respectively mounted at the positions thereof. However, although the first, third and fourth resistor electrodes 331, 333 and 334 are respectively connected to the first, third and fourth power supply terminals 325, 327 and 328, the second resistor electrode 332 is not connected to the second power supply terminal 326.

In short, the drain electrode 309 of the first p-type transistor 301 is connected to the second resistor electrode 332 connected to the source electrode 306 of the second p-type transistor 302. The source electrode and the drain electrode of the transistor structure, in which the second resistor electrode 332 serves as the gate electrode, is connected to the second power supply terminal 326. Here, a symbol DL denotes a diffusion layer, and a symbol ET denotes an electrode terminal serving as a source/drain electrode.

The drain electrode 311 of the first n-type transistor 303 is connected to the drain electrodes 310, 312 of the second p/n-type transistors 302, 304.

Also in the NOR gate 300, the resistor electrodes 331 to 334 and the gate electrodes 313 to 316 are naturally formed in the same gate lengths and in the same process, respectively. The total resistance of the resistor electrodes 331 is equal to the on-state resistances of the transistor device 301. The total resistance of the resistor electrodes 332 is equal to the on-state resistances of the transistor device 302. The total resistance of the resistor electrodes 333 is equal to the on-state resistances of the transistor device 303. The total resistance of the resistor electrodes 334 is equal to the on-state resistances of the transistor device 304.

In the above-mentioned configuration, the NOR gate 300 performs a logical OR operation on binary data inputted to the two input terminals 321, 322, by using the four transistor devices 301 to 304, and then outputs from the one output terminal 323. The four transistor devices 301 to 304 for performing the logical OR operation as mentioned above can operate quickly since the variation of the output impedance resulting from the manufacturing error is protected to thereby avoid the various troubles.

Since the present invention is constituted as mentioned above, it can provide the effects as described below.

In the first transistor device of the present invention, because of the manufacturing error, the increase in the layer width of the gate electrode affects so as to increase the output impedance, and the decrease in the layer width of the gate electrode affects so as to decrease the output impedance. Here, the source electrode and the power supply terminal are connected with each other through the resistor electrode. Thus, because of the manufacturing error, the increase in the layer width of the resistor electrode affects so as to decrease the output impedance, and the decrease in the layer width of the resistor electrode affects so as to increase the output impedance. Also, the resistor electrode is formed in the layer width equal to that of the gate electrode and in the same process. Thus, when the gate length that is the layer width of the gate electrode is varied because of the manufacturing error, the layer width of the resistor electrode is similarly varied. Moreover, the resistance of the resistor electrode is equal to the on-state resistance.

The above-mentioned mechanism can cancel out the affection to the output impedance caused by the variations in the layer widths of the resistor electrode and the gate electrode to thereby protect the variation of the output impedance resulting from the manufacturing error.

In the second transistor device of the present invention, similarly to the conventional examples, because of the manufacturing error, the increase in the layer width of the gate electrode affects so as to increase the output impedance, and the decrease in the layer width of the gate electrode affects so as to decrease the output impedance. Here, the source electrode and the power supply terminal are connected with each other through the plurality of parallel resistor electrodes. Thus, because of the manufacturing error, the increase in the layer width of the resistor electrode affects so as to decrease the output impedance, and the decrease in the layer width of the resistor electrode affects so as to increase the output impedance. Also, the plurality of resistor electrodes are respectively formed in the layer widths equal to those of the gate electrodes and in the same process. Hence, when the gate length that is the layer width of the gate electrode is varied because of the manufacturing error, the layer width of the resistor electrode is similarly varied. Moreover, the total resistance of the plurality of resistor electrodes is equal to the on-state resistance.

The above-mentioned mechanism can cancel out the affection to the output impedance caused by the variations in the layer widths of the plurality of resistor electrodes and the gate electrode to thereby protect the variation of the output impedance resulting from the manufacturing error. Even in a case of the resistor electrode having the excessive sheet resistance, it is possible to generate in total the resistance equal to the on-state resistance in the layer widths respectively equal to the gate electrodes.

In the third transistor device of the present invention, similarly to the conventional examples, because of the manufacturing error, the increase in the layer width of the gate electrode affects so as to increase the output impedance, and the decrease in the layer width of the gate electrode affects so as to decrease the output impedance. Here, the drain electrode and the output terminal are connected with each other through the resistor electrode. Thus, because of the manufacturing error, the increase in the layer width of the resistor electrode affects so as to decrease the output impedance, and the decrease in the layer width of the resistor electrode affects so as to increase the output impedance. Also, the resistor electrode is formed in the layer width equal to that of the gate electrode and in the same process. Hence, when the gate length that is the layer width of the gate electrode is varied because of the manufacturing error, the layer width of the resistor electrode is similarly varied. Moreover, the resistance of the resistor electrode is equal to the on-state resistance.

The above-mentioned mechanism can cancel out the affection to the output impedance caused by the variations in the layer widths of the resistor electrode and the gate electrode to thereby protect the variation of the output impedance resulting from the manufacturing error.

In the fourth transistor device of the present invention, similarly to the conventional examples, because of the manufacturing error, the increase in the layer width of the gate electrode affects so as to increase the output impedance, and the decrease in the layer width of the gate electrode affects so as to decrease the output impedance. Here, the drain electrode and the output terminal are connected with each other through the plurality of parallel resistor electrodes. Thus, because of the manufacturing error, the increase in the layer width of the resistor electrode affects so as to decrease the output impedance, and the decrease in the layer width of the resistor electrode affects so as to increase the output impedance. Also, the plurality of resistor electrodes are respectively formed in the layer widths equal to those of the gate electrodes and in the same process. Hence, when the gate length that is the layer width of the gate electrode is varied because of the manufacturing error, the layer width of the resistor electrode is similarly varied. Moreover, the total resistance of the plurality of resistor electrodes is equal to the on-state resistance The above-mentioned mechanism can cancel out the affection to the output impedance caused by the variations in the layer widths of the plurality of resistor electrodes and the gate electrode to thereby protect the variation of the output impedance resulting from the manufacturing error. Even in a case of the resistor electrode having the excessive sheet resistance, it is possible to generate in total the resistance equal to the on-state resistance in the layer widths respectively equal to the gate electrodes.

In the above-mentioned transistor devices, the switching power of the transistor structure can be added to the switching power of the transistor device by forming the transistor structure in which the resistor electrode serves as the gate electrode. Thus, it is possible to improve the switching response in the transistor device.

In the transistor circuit of the present invention, the variation in the output impedance resulting from the manufacturing error can be protected since the affection to the output impedance caused by the variations of the layer widths of the plurality of resistor electrodes and the gate electrode are canceled out in each of the plurality of transistor devices. Thus, for example, it can function excellently as the output buffer of the quick interface.

In the integrated circuit device of the present invention, the variation in the output impedance of the output buffer resulting from the manufacturing error can be protected since the output impedance of the output buffer and the transmission impedance of the transmission line are equal to each other. Hence, even if the somewhat manufacturing error occurs, the fast operation can be excellently executed without the occurrence of the various troubles, such as the occurrence of reflection noise and the like.

What is claimed is:

1. A MOS (Metal Oxide Semiconductor) transistor, comprising:
    a gate electrode;
    a drain electrode;
    a source electrode;
    wherein said MOS transistor has an on-state resistance when said MOS transistor is in an ON state; and
    a specific electrode, wherein said specific electrode connects said source electrode to a power supply section to which a power is supplied, and has a resistance substantially identical to said on-state resistance, and a width substantially identical to a width of said gate electrode, and said specific electrode and said gate electrode are formed at a same time.

2. A MOS (Metal Oxide Semiconductor) transistor, comprising:
    a gate electrode;
    a drain electrode;
    a source electrode;
    wherein said MOS transistor has an on-state resistance when said MOS transistor is in an ON state;
    a plurality of specific electrodes in parallel with each other, wherein said plurality of specific electrodes connect said source electrode to a power supply section to which a power is supplied; and
    wherein said plurality of specific electrodes have a resistance substantially identical to said on-state resistance in total, and each of said plurality of specific electrodes has a width substantially identical to a width of said gate electrode, and said each specific electrode and said gate electrode are formed at a same time.

3. A MOS (Metal Oxide Semiconductor) transistor, comprising:
    a gate electrode;
    a drain electrode;
    a source electrode;
    wherein said MOS transistor has an on-state resistance when said MOS transistor is in an ON state; and
    a specific electrode, wherein said specific electrode connects said drain electrode to an output section from which an output signal outputted from said MOS transistor is outputted, and has a resistance substantially identical to said on-state resistance, and a width substantially identical to a width of said gate electrode, and said specific electrode and said gate electrode are formed at a same time.

4. A MOS (Metal Oxide Semiconductor) transistor, comprising:
    a gate electrode;
    a drain electrode;
    a source electrode;
    wherein said MOS transistor has an on-state resistance when said MOS transistor is in an ON state;
    a plurality of specific electrodes in parallel with each other, wherein said plurality of specific electrodes connect said drain electrode to an output section from which an output signal outputted from said MOS transistor is outputted, and
    wherein said plurality of specific electrodes have a resistance substantially identical to said on-state resistance in total, and each of said plurality of specific electrodes has a width substantially identical to a width of said gate electrode, and said each specific electrode and said gate electrode are formed at a same time.

5. A MOS transistor according to claim 1, further comprising:
    a specific MOS transistor, wherein said specific MOS transistor has said specific electrode as a specific gate electrode of said specific MOS transistor, and a specific source electrode and a specific drain electrode of said specific MOS transistor which are connected to said power supply section.

6. A MOS transistor according to claim 2, further comprising:

a plurality of specific MOS transistors, wherein said plurality of specific MOS transistors have said plurality of specific electrodes as a plurality of specific gate electrodes of said plurality of specific MOS transistors, respectively, and a plurality of specific source electrodes and a plurality of specific drain electrodes of said plurality of specific MOS transistors respectively, said plurality of specific source electrodes and said plurality of specific drain electrodes being connected to said power supply section.

7. A MOS transistor according to claim 3, further comprising:

a specific MOS transistor, wherein said specific MOS transistor has said specific electrode as a specific gate electrode of said specific MOS transistor, and a specific source electrode and a specific drain electrode of said specific MOS transistor which are connected to said output section.

8. A MOS transistor according to claim 4, further comprising:

a plurality of specific MOS transistors, wherein said plurality of specific MOS transistors have said plurality of specific electrodes as a plurality of specific gate electrodes of said plurality of specific MOS transistors, respectively, and a plurality of specific source electrodes and a plurality of specific drain electrodes of said plurality of specific MOS transistors respectively, said plurality of specific source electrodes and said plurality of specific drain electrodes being connected to said output section.

9. A transistor circuit, comprising:

complementary transistors, wherein each of said complementary transistors is a MOS (Metal Oxide Semiconductor) type; and a plurality of power supply sections to which a power is supplied, and wherein each of said complementary transistors includes:
a gate electrode;
a drain electrode;
a source electrode;
wherein said each complementary transistor has an on-state resistance when said each complementary transistor is in an ON state;
a specific electrode, wherein said specific electrode connects said source electrode to one of said plurality of power supply sections, and has a resistance substantially identical to said on-state resistance, and a width substantially identical to a width of said gate electrode, and said specific electrode and said gate electrode are formed at a same time.

10. A transistor circuit, comprising:

complementary transistors, wherein each of said complementary transistors is a MOS (Metal Oxide Semiconductor) type; and an output section from which an output signal outputted from said complementary transistors is outputted, and wherein each of said complementary transistors includes:
a gate electrode;
a drain electrode;
a source electrode;
wherein said each complementary transistor has an on-state resistance when said each complementary transistor is in an ON state;
a specific electrode, wherein said specific electrode connects said drain electrode to said output section, and has a resistance substantially identical to said on-state resistance and a width substantially identical to a width of said gate electrode, and said specific electrode and said gate electrode are formed at a same time.

11. A semiconductor integrated circuit, comprising:

an output buffer including an output section from which an output signal outputted from said output buffer is outputted, wherein said output buffer includes complementary transistors, each of said complementary transistors being a MOS (Metal Oxide Semiconductor) type;

a transmission path having a transmission impedance, wherein said transmission path is connected to said output section; and a plurality of power supply sections to which a power is supplied, wherein said plurality of power supply sections are connected to said complementary transistors, respectively, and wherein said each complementary transistor includes:
a gate electrode;
a drain electrode;
a source electrode;
wherein said each complementary transistor has an on-state resistance when said each complementary transistor is in an ON state;
a specific electrode, wherein said specific electrode connects said source electrode to one of said plurality of power supply sections, and has a resistance substantially identical to said on-state resistance, and a width substantially identical to a width of said gate electrode, and said specific electrode and said gate electrode are formed at a same time, and
wherein said transmission impedance is substantially identical to an output impedance, of each complementary transistor, corresponding to a specific transmission path arranged from said one power supply section to said output section, when each complementary transistor is in an ON state.

12. A semiconductor integrated circuit, according to claim 11, wherein said each complementary transistor further including:

a specific MOS transistor, wherein said specific MOS transistor has said specific electrode as a specific gate electrode of said specific MOS transistor, and a specific source electrode and a specific drain electrode of said specific MOS transistor which are connected to said one power supply section.

* * * * *